United States Patent
Stoicescu et al.

(10) Patent No.: US 7,471,016 B2
(45) Date of Patent: Dec. 30, 2008

(54) LOW PASS FILTER

(75) Inventors: Emanuel Stoicescu, Bucharest (RO); Constantin Bucur, Santa Clara, CA (US)

(73) Assignee: O2Micro International Limited, Georgetown, Grand Cayman (KY)

( * ) Notice: Subject to any disclaimer, the term of this patent is extended or adjusted under 35 U.S.C. 154(b) by 0 days.

(21) Appl. No.: 11/611,571

(22) Filed: Dec. 15, 2006

(65) Prior Publication Data

US 2007/0241734 A1    Oct. 18, 2007

Related U.S. Application Data

(60) Provisional application No. 60/751,625, filed on Dec. 19, 2005.

(51) Int. Cl.
*H02J 7/00* (2006.01)
*H02J 9/00* (2006.01)

(52) U.S. Cl. .................................. 307/150; 320/166

(58) Field of Classification Search ............. 307/150; 320/166
See application file for complete search history.

(56) References Cited

U.S. PATENT DOCUMENTS

| 5,254,930 | A  | * | 10/1993 | Daly ........................ 320/119 |
| 5,438,250 | A  | * | 8/1995  | Retzlaff ..................... 320/128 |
| 6,157,165 | A  | * | 12/2000 | Kinoshita et al. ........... 320/116 |
| 6,208,117 | B1 | * | 3/2001  | Hibi ........................ 320/134 |
| 7,230,352 | B2 | * | 6/2007  | Bedard et al. ............... 307/59 |

* cited by examiner

*Primary Examiner*—Stephen W Jackson
*Assistant Examiner*—Carlos Amaya
(74) *Attorney, Agent, or Firm*—Grossman, Tucker, Perreault & Pfleger, PLLC

(57) ABSTRACT

The present disclosure provides a method for filtering in a cordless electrical device. The method may include coupling a filter network, a microcontroller and a plurality of battery cells having a cell voltage and a current. The method may further include operatively connecting at least one switched capacitor low-pass filter to the plurality of battery cells, the at least one switched capacitor low-pass filter configured to receive a signal from the filter network. The method may also include filtering the signal from the filter network, delivering a filtered signal input to an ADC and generating an output from the ADC.

21 Claims, 6 Drawing Sheets

LOW PASS FILTER

CROSS-REFERENCE TO RELATED APPLICATIONS

The present disclosure claims the benefit of U.S. Provisional Application Ser. No. 60/751,625 filed Dec. 19, 2005, all the teachings of which are incorporated herein by reference.

FIELD

This disclosure relates to low pass filtering in a portable electronic device.

BACKGROUND

Low-pass filters may be utilized in a variety of applications to pass low frequency components and to attenuate higher frequency components of a complex signal. One application of a low-pass filter is in a cordless electrical device that may be powered by a battery pack.

BRIEF DESCRIPTION OF THE DRAWINGS

Features of embodiments of the claimed subject matter will become apparent as the following Detailed Description proceeds, and upon reference to the Drawings, wherein like numerals depict like parts, and in which:

Although the Detailed Description will proceed with reference being made to illustrative embodiments, many alternatives, modifications, and variations thereof will be apparent to those skilled in the art.

DETAILED DESCRIPTION

Low-pass filters may be utilized to filter the voltage and current spikes of a pulse width modulated (PWM) current and voltage waveform in a cordless electrical device. Some devices have attempted to filter the voltage and current spikes of a PWM current and voltage waveform by utilizing continuous time filters, non-fully differential topologies, and low order filters. One conventional low order filter may be a resistor-capacitor (RC) low pass filter. This particular design may utilize a square waveform having 100% ripple at the input. An RC low-pass filter would require a resistor value of 100 kΩ and a capacitor value of 1.5 μF in order to obtain 16 bits of precision (i.e., 96 dB of attenuation) of the average voltage of a battery cell. However, at these resistor and capacitor values the settling time may be excessive. For example, using these values the settling time for this particular RC low pass filter may be approximately $10*\tau$ (where $\tau = R*C$) or as high as 65 seconds.

Generally, this disclosure describes a low pass filter that may be configured for use with a portable electrical device. The present disclosure may provide a fully integrated low pass filter configured to average the cell voltage of a battery pack. For example, a power tool, such as a cordless drill, may include a low pass filter in order to average the cell voltage of the drill's battery pack. In some embodiments, the filter may include a low cutoff frequency and 16 bits (96 dB) insertion attenuation at the pulse wave modulation frequency. Thus, the present disclosure describes a low pass filter having a reduced settling time that may be configured to average the cell voltage of a battery pack.

Figure 1:
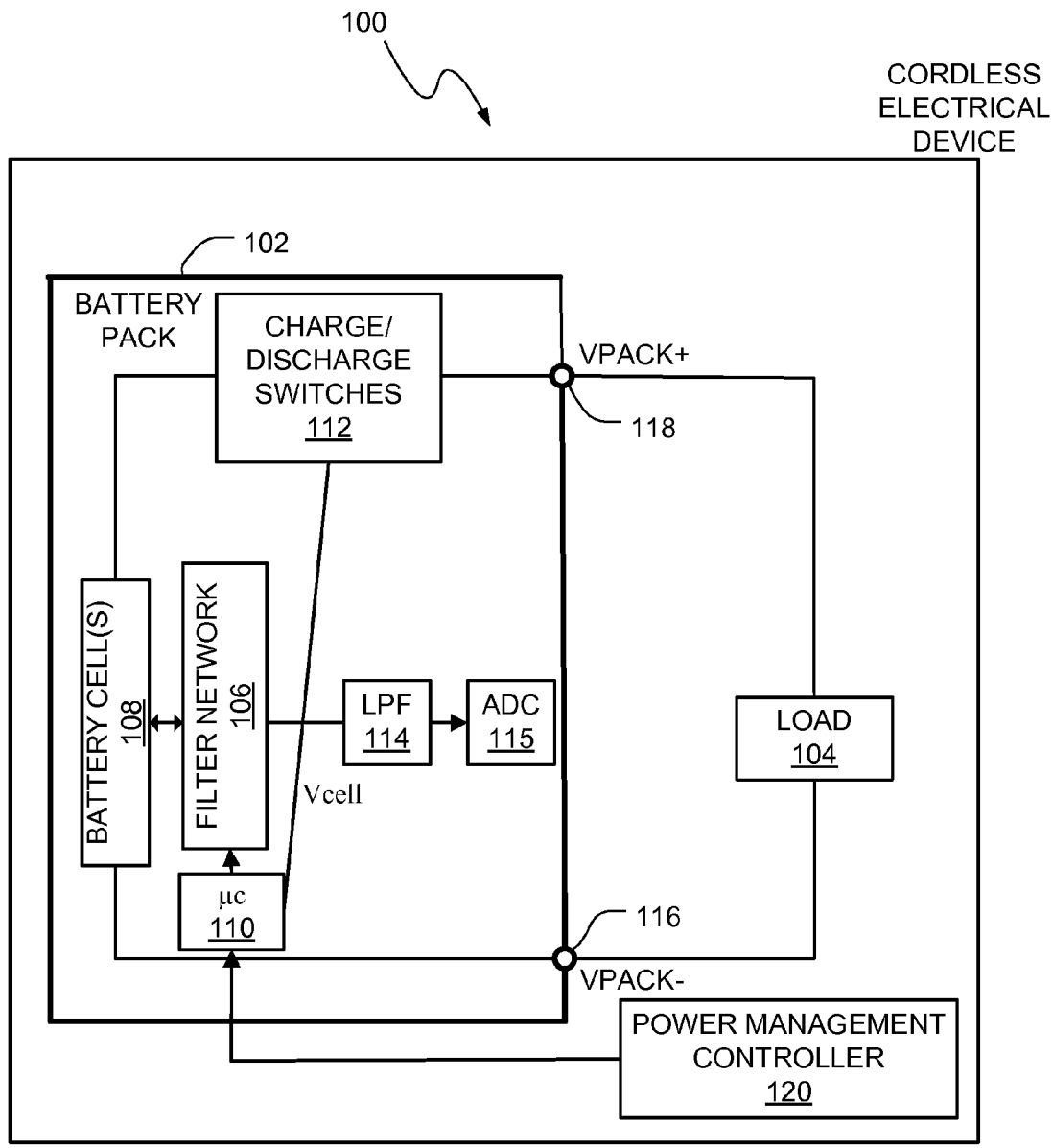
FIG. 1 is a diagram of an exemplary embodiment of a cordless electrical device consistent with the present disclosure.

FIG. 1 illustrates one exemplary embodiment of a cordless electrical device 100 in accordance with the present disclosure. Some examples of cordless electrical devices may include, but are not limited to, power tools (e.g. drills, circular saws, sanders, screwdrivers, etc.), laptop computers, cell phones, and personal digital assistants. Of course, alternative devices may also be used without departing from the scope of the present disclosure.

The device shown in embodiment 100 may include a battery pack 102 that may provide power to a load 104 during a battery supply mode. Battery pack 102 may include filter network 106, battery cells 108, microcontroller (μC) 110, charge/discharge switches 112, low-pass filter 114, analog-to-digital converter (ADC) 115 and battery terminals 116 and 118. Battery terminals 116 and 118 may be coupled to load 104 and configured to deliver power thereto. It is envisioned that battery pack 102 may be an entirely removable or replaceable unit, or alternatively, it could be constructed as a monolithically formed unit within device 100. In addition to providing power to the load 104 in the battery supply mode, the battery pack 102 may also be recharged by a DC power source (not illustrated) such as an ACDC adapter in a battery charge mode. Of course alternative methods of recharging are also within the scope of the present disclosure. The battery pack 102 may include charge and discharge switches 112 that may be configured to facilitate operation of the battery pack 102 in the battery supply mode and battery charge mode.

In some embodiments there may be variations due to load 104 or the noise of the motor. For example, the load/no load variation in battery cells 108 may be approximately 1 volt while the noise of the motor (e.g., a DC brush motor) may add another 3 volts of variation. These variations may result in a noisy signal between battery cells 108 and filter network 106. This signal may include both the DC voltage signal and the PWM signal, which may control the relative speed of device 100. In some embodiments, filter network 106 may be configured to filter the noisy signal provided by battery cells 108 leaving only the DC variation due to the load. For example, filter network 106 may smooth out the variations and attenuate (e.g., approximately 20 dB) the signal from battery cells 108. This attenuated signal may then enter low pass filter 114, which may further attenuate the signal (e.g., an additional 60-70 dB). In some embodiments, filter network 106 may include an RC filter topology.

The output of low pass filter 114 may then enter an analog-to-digital converter 115 (ADC). ADC 115 may be any variety of analog to digital converter configured to convert analog signals to associated digital signals such as a single-slope integrating ADC, a dual-slope integrating type ADC, or a sigma-delta type ADC. Of course, alternative ADC's are also within the scope of the present disclosure. In some embodiments, ADC 115 may be configured to provide 16 bits of resolution, which may correspond to approximately 90 dB of total attenuation.

Battery cells 108 may comprise any variety of battery chemistries such as lithium ion cells. Other types of batteries could include, but are not limited to, lead-acid, nickel-cadmium, lithium-ion polymer, nickel-metal hydride, aluminum or any other rechargeable battery. Battery cells 108 may be coupled to battery terminals 116 and 118 and may be in communication with microcontroller 110. Moreover, battery cells 108 may be configured in a series, parallel or hybrid arrangement in order to deliver a desired voltage, capacity, or power density.

Microcontroller 110 may be coupled to filter network 106 and may be configured to monitor the voltage levels of battery cells 108. Microcontroller 110 may be any variety of processor or controller configured to execute instructions to accomplish a variety of operations. Microcontroller 110 may control the low-pass filter 114 as well as channel multiplexing, which is discussed below with reference to FIGS. 4-5. In some embodiments, microcontroller 110 may measure the temperature from each battery cell to determine if a cell is above or below a particular temperature. Moreover, microcontroller 110 may be configured to receive and execute instructions from power management controller 120. These instructions may include specific instructions regarding which battery cell to couple to low pass filter 114. This determination may be based upon the voltage status of battery cells 108 as determined by microcontroller 110. Microcontroller 110 may also control the state of charge and discharge switches 112 (e.g. through power management controller 120).

Charge and discharge switches 112 may be in communication with battery cells 108 and may dictate the direction of current flow within battery pack 102. When charge/discharge switch 112 is in the 'charge' position current may flow from terminals 116 and 118 into battery cells 108. Alternatively, when charge/discharge switches 112 are in the 'discharge' position current may be delivered to load 104 in order to provide power to the device. A reverse-current battery diode circuit (not shown) may be controlled by charge/discharge switches 112 and may be connected to VPACK− terminal 116 and VPACK+ terminal 118 of battery pack 102. This may prevent reverse current flow and reverse bias voltage from damaging battery pack 102 or other internal components. This protection may be provided using a variety of different components, including, but not limited to, semiconductor diodes (e.g. Schottky) and metal oxide semiconductor field effect transistors (MOSFETS).

Figure 2:
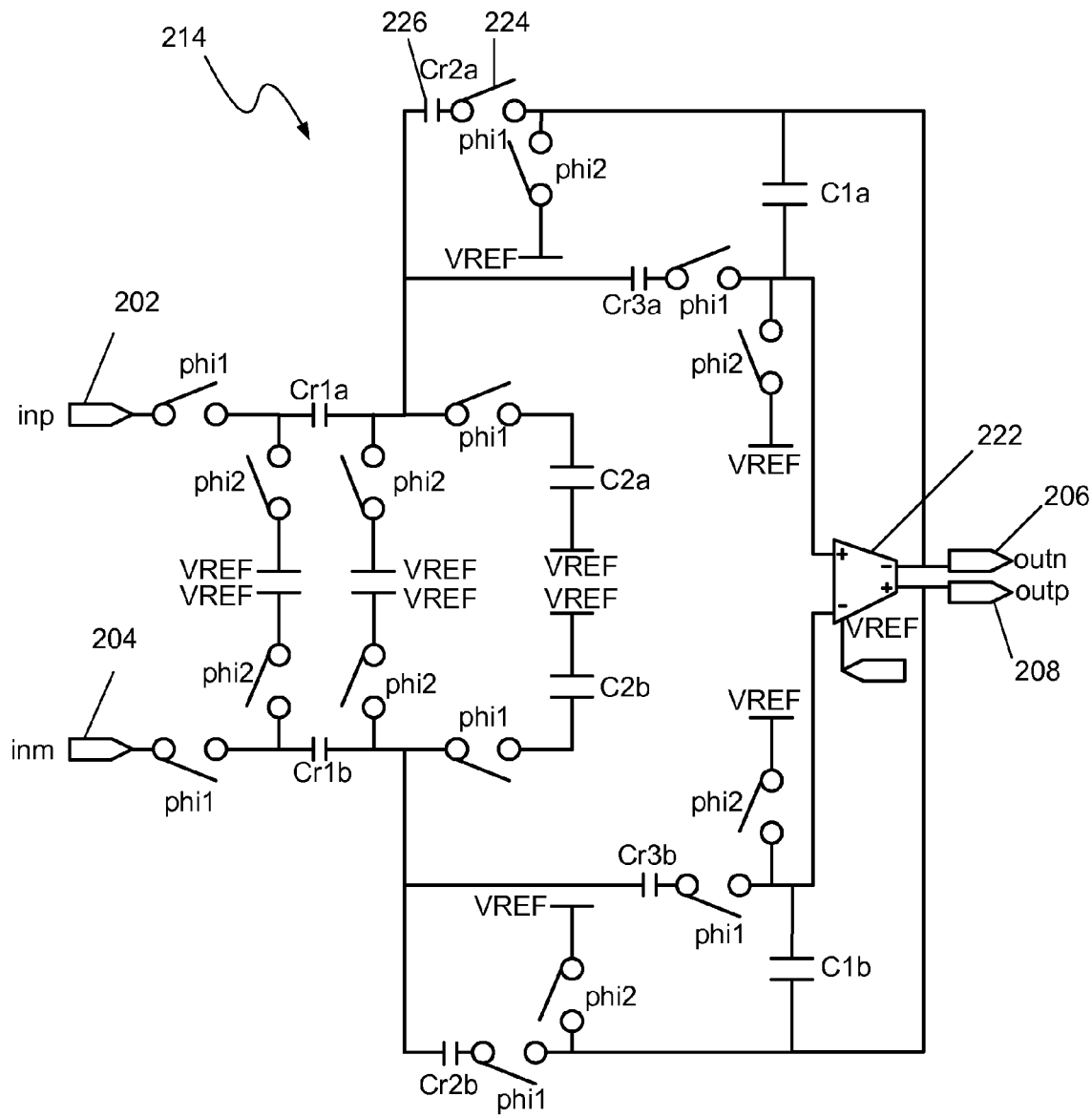
FIG. 2 is a diagram of an exemplary embodiment of a low pass filter that may be utilized in accordance with the present disclosure.

One embodiment of a low pass filter 214 having a switched capacitor topology is shown in FIG. 2. Low pass filter 214 may be implemented in circuitry and may be coupled to battery cells 108 through filter network 106 as shown in FIG. 1. Low pass filter 214 may include input terminals 202 and 204 which may each be configured to receive an input. In one exemplary embodiment of the present disclosure the input may be a square waveform having 100% ripple. Other waveforms are also envisioned including, but not limited to, sawtooth, square, sinusoidal and triangular. In some embodiments input terminals 202 and 204 may receive differential inputs which may be configured to reduce common mode noise.

Low pass filter 214 may also include operational amplifier 222 having output terminals 206 and 208. Low pass filter 214 may provide a filtered output signal at output terminals 206 and 208. In some embodiments, operational amplifier 222 may be a differential input-differential output operational amplifier. The difference between outputs 206 and 208 may correspond to the actual voltage of an individual battery cell. Output terminals 206 and 208 may be configured to provide an output to a variety of circuitries that may include, but is not limited to, sample and hold circuitry, analog to digital converters (ADC) and battery gas gauge circuitry. Battery gas gauge circuitry (not shown) may monitor the remaining capacity of battery cells 108 and may provide an indication of the same to a user of device 100. Some indicators may include state-of-charge indicators, and gas gauges with and without a central processing unit (CPU). The gas gauge circuitry may incorporate an onboard processor to calculate the remaining battery capacity and system runtime (i.e., time to empty). Moreover, the gas gauge circuitry may be configured to measure the battery's charge and discharge currents. A separate ADC may be used to measure battery voltage and temperature. Gas gauge circuitry may be positioned in any suitable location within device 100, including, but not limited to, within microcontroller 110 or power management controller 120.

Some embodiments may further include a plurality of electrical components, such as switches 224 and capacitors 226. The switches 224 of low pass filter 214 may be responsive to clock signals (e.g., phi1 and phi2), which may be controlled by a system clock (not shown). The system clock may be contained within microcontroller 110. Some embodiments may not require any resistors and may utilize a minimal amount of area.

Figure 3:
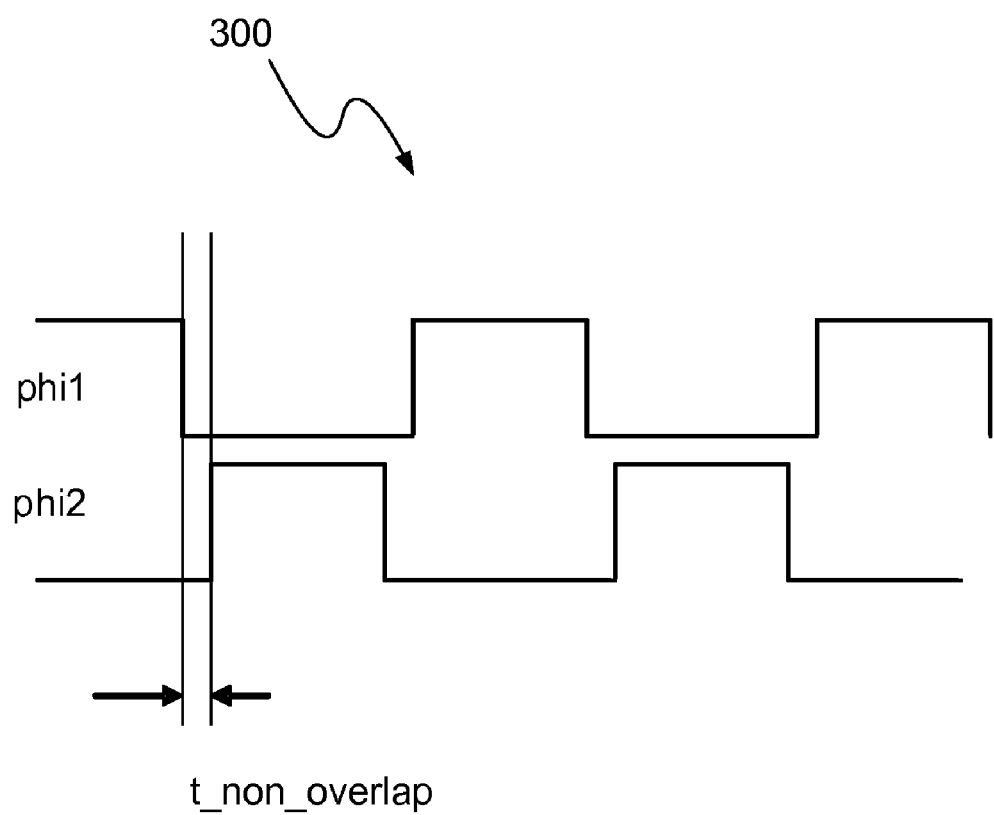
FIG. 3 is a timing diagram in accordance with the present disclosure.

FIG. 3 shows a timing diagram 300 of the phi1 and phi2 signals of a second order low pass filter in accordance with one embodiment of the present disclosure. As indicated by the timing diagram, phi1 and phi2 may not be active simultaneously. Moreover, the clock cycles of phi1 and phi2 may alternate between 'on' and 'off' positions. There may be a brief period of time where both phi1 and phi2 are both deactivated as shown by t_non_overlap. In some embodiments, the clock edges of the clock phases may be controlled and smoothened to reduce capacitive coupling of the clock into the signal path and the charge injection effect, which will be discussed in greater detail below.

Charge injection may arise as an error voltage in the difference of potential across a capacitor driven by a switch transistor. Low pass filter 214 may utilize minimum sized CMOS switches, for example, CMOS switches that are relatively small to minimize the charge injection. For example, these switches may comprise PMOS or NMOS type switches of various sizes. Further, the clock phases (phi1 and phi2) may be interleaved to reduce the effect of any parasitic capacitances of the poly insulator poly (PIP) capacitors to minimize charge injection induced offset.

Moreover, the number of switches of low pass filter 114, 214, etc. may be controlled by smashing switches, where possible, to reduce charge injection. As is understood in the art, smashing switches are a special set of switches which control the switches of the switched capacitor filter, and are capable very fast and controlled turn-off time, which may further reduce the charge injection The precision of low pass filter 214 may be improved by precisely matching capacitor ratios. Capacitor matching may result in a filter having a cutoff frequency proportional to the external clock frequency. The cut-off frequency may be varied by the clock frequency, therefore requiring no change in external circuitry and no additional external capacitors or inductors. The switched capacitor filter may utilize crystal-controlled oscillators, or filters whose cutoff frequencies are variable over a wide range by changing the clock frequency. In some embodiments, a passive RC low-pass filter may be included ahead of the switched capacitor filter in order to remove any high-frequency signals and prevent unwanted aliasing.

In some embodiments, low pass filter 214 may be configured to improve precision by about 3 or 4 bits, e.g., up from 11 bits to 13-14 bits, for example, by cascading several filters.

Low pass filter 214 may also include additional features for reducing switching charge injection, improving common mode rejection and improving DC precision (including non-linearity). In some embodiments, the settling time of the low pass filter may be less than 1 millisecond and the output may provide 16 bits of resolution.

A plurality of second order low pass filters consistent with that illustrated in FIG. 2 may be cascaded together to yield a higher order filter. For example, three such low pass filters may be cascaded together to yield a $6^{th}$ order filter. Further, a variety of different components may be used in accordance with the embodiments described herein. For example, certain components having a high absolute accuracy and a low sensitivity to temperature may be selected. For example, low tolerance resistors and capacitors and low-noise amplifiers may be used to minimize the noise from the active components.

Figure 4:
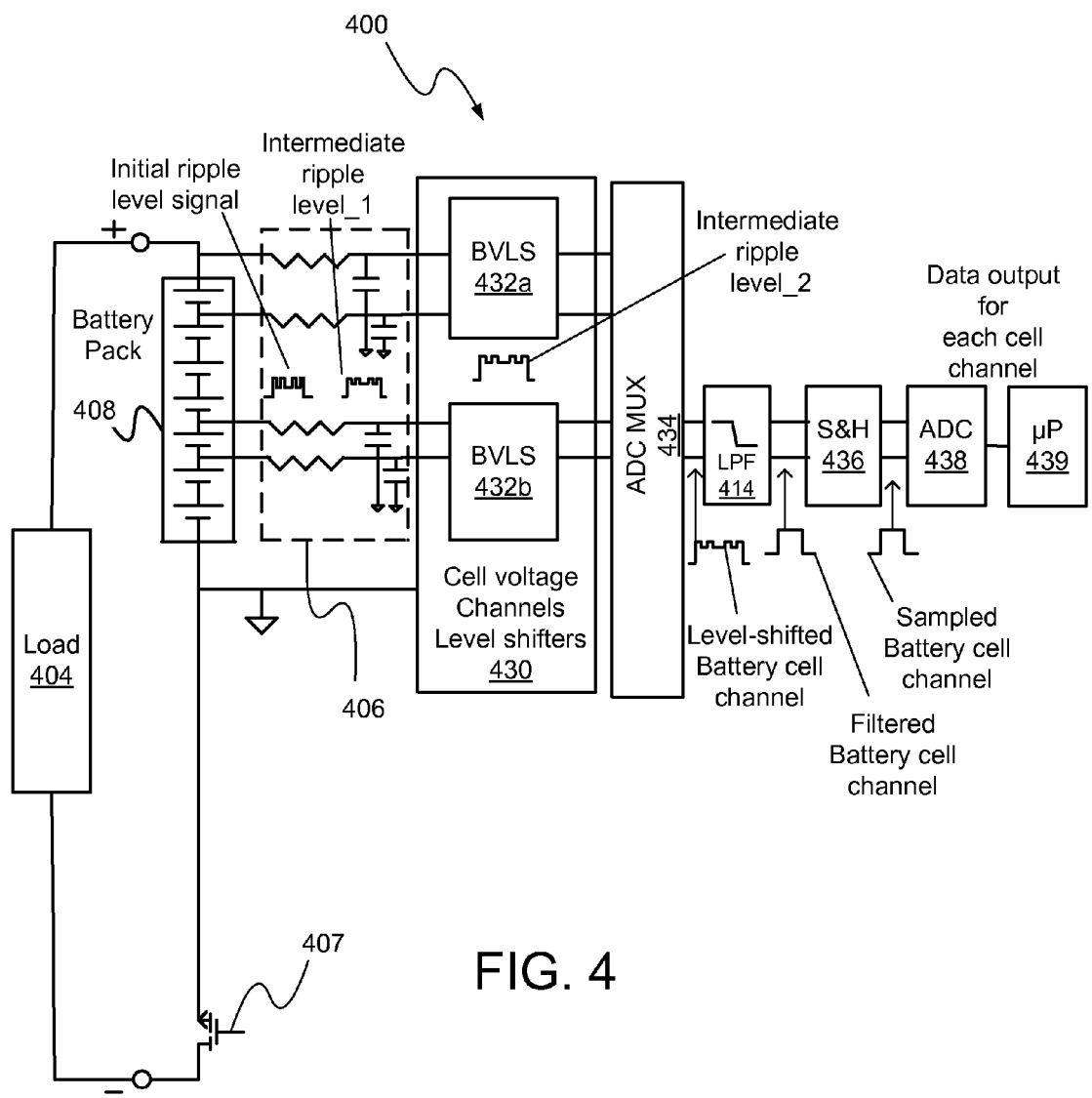
FIG. 4 shows a diagram of an exemplary embodiment in accordance with the present disclosure.

FIG. 4 shows a diagram of an exemplary embodiment 400 in accordance with the present disclosure. Battery cells 408 may be coupled to load 404 and filter network 406 via a switch 407. Battery pack 408 may be configured to provide a cell voltage having an initial ripple level signal to a filter network, such as an RC network. Filter network 406 may attenuate this initial ripple level by some amount to provide a intermediate ripple level signal (e.g., intermediate ripple level_1) as shown in FIG. 4. In some embodiments, the attenuation may be approximately 20 dB. This intermediate ripple level signal may be sent to a cell voltage channel level shifter 430. Cell voltage channel level shifter 430 may include a number of battery voltage level shifters (BVLS) 432a, 432b, etc. which may each correspond to a particular channel. These battery voltage level shifters 432a and 432b may be configured to produce a second intermediate ripple level signal (e.g., second intermediate ripple level signal_2). These signals leave their corresponding battery voltage level shifter 432 and enter an analog-to-digital converter 434 where the signals are converted and multiplexed. The ADC 434 may direct a level-shifted battery cell channel signal input to low pass filter 414. The output of low pass filter 414 may be a filtered battery cell channel signal and may be sent to a sample and hold unit 436. Sample and hold unit 436 may provide a sampled battery cell channel signal to a second analog-to-digital converter 438. This ADC 438 may then provide the data output corresponding to each cell channel to a microprocessor 439. As described above, low pass filter 414 may be a switched capacitor filter and/or a $6^{th}$ order filter.

Figure 5:
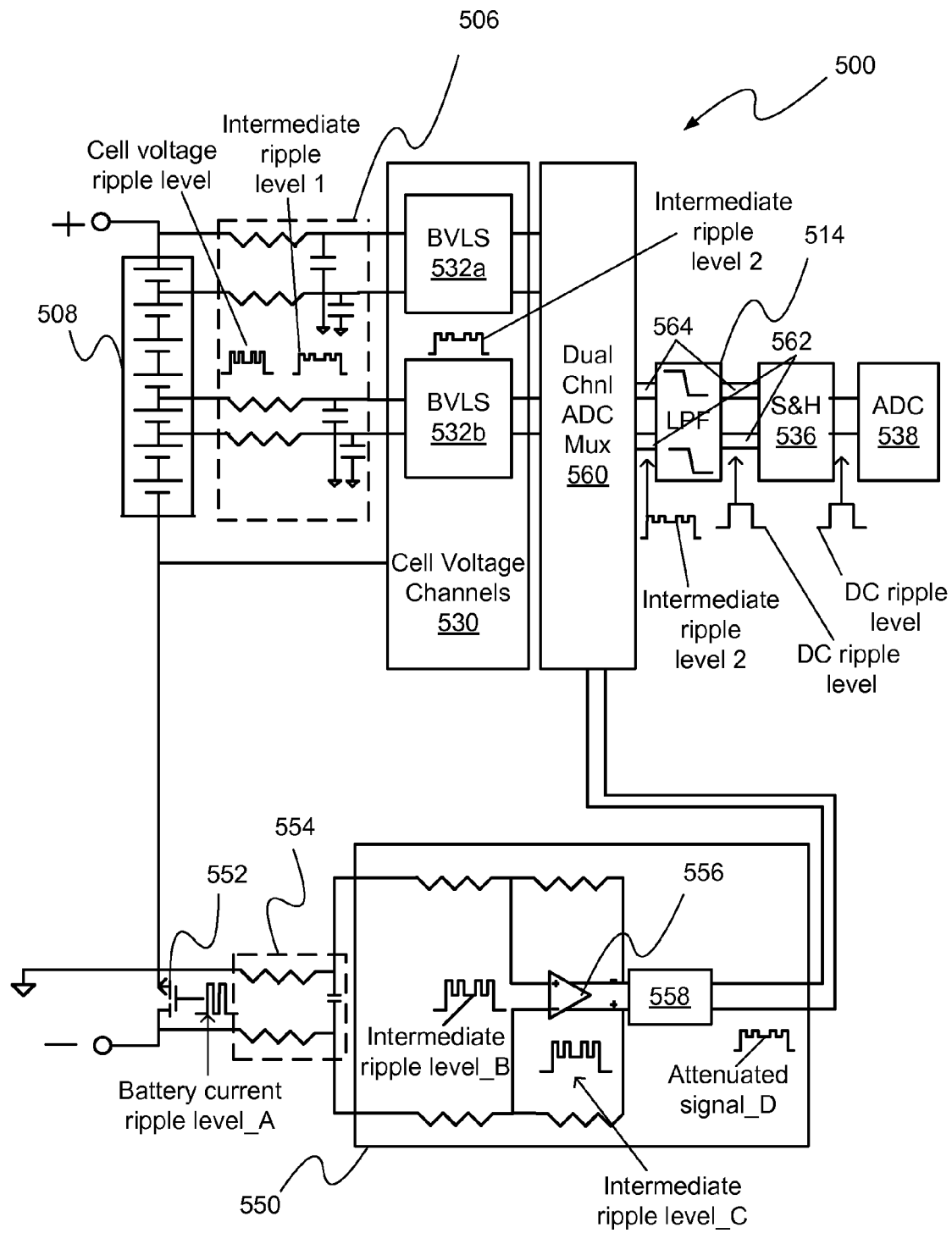
FIG. 5 shows a diagram of yet another exemplary embodiment in accordance with the present disclosure.

FIG. 5 shows another exemplary embodiment 500 in accordance with the present disclosure. This embodiment may incorporate some or all of the elements of FIG. 4 and may further include dual channel ADC filtering techniques. A current channel 550 may be provided in this embodiment, which may be configured to receive a battery current ripple level signal (e.g., battery current ripple level signal_A). This embodiment may further include a switch 552, which may be a transistor, such as a bipolar junction transistor (BJT) or a metal oxide field effect transistor (MOSFET). Switch 552 may provide a signal (e.g., battery current ripple level_A) to an additional RC network 554. RC network 554 may attenuate this current ripple level to an intermediate ripple level (e.g., intermediate ripple level_B). This intermediate ripple level signal may then be input to programmable gain amplifier (PGA) 556 having inverting and non-inverting inputs. PGA 556 may be configured to amplify the intermediate ripple level signal. PGA 556 may utilize any number of suitable components to amplify the signal, including, but not limited to, op amps, switches and resistors. An amplified signal (e.g., intermediate ripple level_C) may then enter an additional low pass filter circuit 558. In some embodiments, low pass filter 558 may be a second order filter. Further, low pass filter 558 may be a switched capacitor filter and may be similar to those described herein. Low pass filter 558 may be configured to attenuate this input signal and to provide an attenuated signal (e.g., attenuated signal_D) to a dual channel analog-to-digital converter 560.

Dual channel ADC 560 may be configured to utilize a multiplexer to interleave a number of inputs. For example, the outputs from both cell voltage channel 530 and current channel 550 may be inputs to dual channel ADC 560 as shown in FIG. 5. In some embodiments, dual channel ADC 560 may distribute channels into odd channels 562 and even channels 564. For example, if 10 channels are input to dual channel ADC 560, channels 1, 3, 5, 7 and 9 may be distributed over the odd channel. Similarly, channels 2, 4, 6 and 8 may be distributed over the even channel. These even and odd channels may be multiplexed and input into low pass filter 514 as described herein. In some embodiments, low pass filter 514 may include a number of filters. For example, the even and odd channel signals may be inputs to a $6^{th}$ order switched capacitor low pass filter. In some embodiments, the outputs of low pass filter 514 may remove any variation due to the load and may provide a DC ripple level signal. This DC ripple level signal may then enter a sample and hold stage 536 before entering an additional ADC 538, which may provide, for example, 16 bits of resolution for each battery cell.

Figure 6:
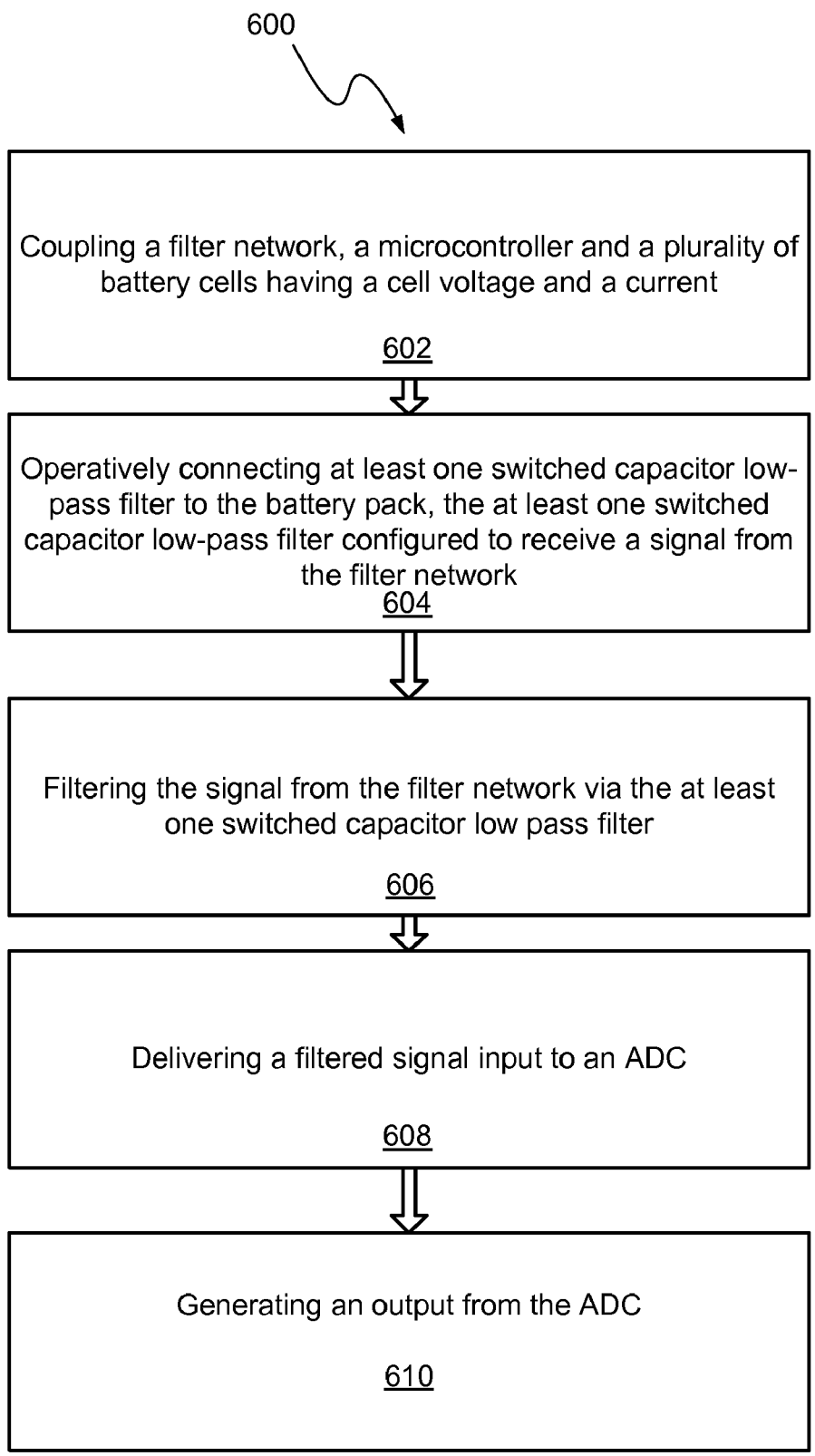
FIG. 6 shows a method consistent with another exemplary embodiment of the present disclosure.

FIG. 6 shows another embodiment 600 of the present disclosure describing a method for filtering in an electrical device. The method may include coupling a filter network, a microcontroller and a plurality of battery cells having a cell voltage and a current (602). A switched capacitor low-pass filter may be coupled to the battery pack and configured to receive a signal from the filter network (604). The method may also include filtering the signal from the filter network via the at least one switched capacitor low pass filter (606). The method may further include delivering a filtered signal input to an ADC (608) and generating an output from the ADC (610). The method may further include additional steps, such as, delivering power from a battery pack to the load and/or recharging the battery pack and providing an indication of a capacity of the plurality of battery cells. This method may further utilize any or all of the components described herein, such as, ADCs, cell voltage channel level shifters and sample and hold units to attenuate, generate and process various signals.

The present disclosure provides numerous advantages over the prior art. For example, a switched capacitor low pass filter may be configured to average the cell voltage and current of a cordless electrical device. In some embodiments a higher order low pass filter is provided that may be configured to provide the average voltage to up to 16 bits of precision while reducing the settling time to less than 1 millisecond.

As used in any embodiment described herein, "circuitry" may comprise, for example, singly or in any combination, hardwired circuitry, programmable circuitry, state machine circuitry, and/or firmware that stores instructions executed by programmable circuitry. It should be understood at the outset that any of the operative components described in any embodiment herein may also be implemented in software, firmware, hardwired circuitry and/or any combination thereof.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An apparatus comprising:
a cordless electrical device including a battery pack, the battery pack including a filter network, a microcontroller and a plurality of battery cells having a cell voltage and a current; and
at least one low-pass filter operatively connected to the plurality of battery cells, the at least one low-pass filter includes a switched capacitor network configured to average the cell voltage and the current of the plurality of battery cells;
wherein the switched capacitor network includes a first plurality of switches configured to respond to a first clock signal and a second plurality of switches configured to respond to a second clock signal, wherein each of the first and second clock signals alternate between on and off positions in a complementary fashion with respect to one another, and there is at least one period of time during each clock cycle where the first and second clock signals are both off.

2. The apparatus according to claim 1, wherein the switched capacitor network has one or more cutoff frequencies that are variable by changing a clock frequency.

3. The apparatus according to claim 1, wherein the microcontroller is configured to receive and execute a set of instructions from a power management controller.

4. The apparatus according to claim 1, further comprising at least one cell voltage channel shifter operatively connected to the filter network.

5. The apparatus according to claim 1, further comprising a programmable gain amplifier configured to receive and amplify a first signal from an RC network, the programmable gain amplifier further configured to provide a second signal to an analog-to-digital converter.

6. The apparatus according to claim 1, wherein the at least one low-pass filter is a higher order filter configured to provide an average voltage to up to 16 bits of precision and a settling time to less than 1 millisecond.

7. The apparatus according to claim 1, wherein the at least one low-pass filter includes a series of cascaded low-pass filters, the cascaded low-pass filters configured to produce a higher order filter.

8. The apparatus according to claim 1, further comprising a dual channel convener configured to provide at least one input to a low pass filter.

9. An apparatus comprising:
an integrated circuit (IC) comprising at least one switched capacitor low-pass filter configured to receive a first filtered signal from a first analog-to-digital converter, the at least one low-pass filter configured to deliver a second filtered signal to a second analog-to-digital converter;
wherein the at least one switched capacitor low-pass filter includes a first plurality of switches configured to respond to a first clock signal and a second plurality of switches configured to respond to a second clock signal, wherein each of the first and second clock signals alternate between on and off positions in a complementary fashion with respect to one another, and there is at least one period of time during each clock cycle where the first and second clock signals are both off.

10. The apparatus according to claim 9, further comprising a filter network operatively connected to a microcontroller and a plurality of battery cells, the filter network configured to receive and attenuate a battery cell voltage signal.

11. The apparatus according to claim 10, further comprising a microcontroller configured to determine a voltage level of each of the plurality of battery cells.

12. The apparatus according to claim 10, wherein the filter network is an RC filter network.

13. The apparatus according to claim 9, wherein the second analog-to-digital convener is configured to provide a final signal having at least 16 bits of precision and a settling time of less than one millisecond.

14. A method for filtering in a cordless electrical device comprising:
operatively coupling a filter network to a plurality of battery cells;
operatively coupling a switched capacitor low-pass filter to the filter network, the switched capacitor low-pass filter including a first plurality of the switches configured to respond to a first clock signal and a second plurality of the switches configured to respond to a second clock signal, wherein each of the first and second clock signals alternate between on and off positions in a complementary fashion with respect to one another, and there is at least one period of time during each clock cycle where the first and second clock signals are both off;
filtering a signal from the filter network with the switched capacitor low-pass filter;

15. The method according to claim 14, further comprising:
generating a digital signal based on a filtered signal output by the switched capacitor low pass filter;
wherein the digital signal is associated with a DC precision of at least 16 bits and a settling time of less than 1 millisecond.

16. The method according to claim 14, further comprising operatively connecting at least one analog-to-digital converter (ADC) to a cell voltage channel level shifter, the ADC configured to deliver an attenuated signal to the switched capacitor low-pass filter.

17. The method according to claim 14, where the switched capacitor low-pass filter is a $6^{th}$ order filter.

18. The method according to claim 14, wherein filtering includes filtering a waveform having 100% ripple.

19. The method according to claim 14, wherein the switched capacitor low-pass filter is configured to receive a square wave input signal and to deliver a filtered output signal.

20. The method according to claim 14, wherein the switched capacitor low-pass filter provides an output to a sample and hold unit.

21. The method according to claim 14, wherein the switched capacitor low-pass filter includes a fully differential active filter topology.

* * * * *